(12) United States Patent
Karner et al.

(10) Patent No.: US 11,155,914 B2
(45) Date of Patent: Oct. 26, 2021

(54) WEAR AND/OR FRICTION REDUCTION BY USING MOLYBDENUM NITRIDE BASED COATINGS

(71) Applicant: Oerlikon Surface Solutions AG, Pfäffikon, Pfäffikon (CH)

(72) Inventors: Johann Karner, Triesen (LI); Neir Beganovic, Buchs (CH); Juergen Ramm, Maienfeld (CH); Beno Widrig, Bad Ragaz (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 201 days.

(21) Appl. No.: 16/091,220

(22) PCT Filed: Apr. 7, 2017

(86) PCT No.: PCT/EP2017/000437
§ 371 (c)(1),
(2) Date: Oct. 4, 2018

(87) PCT Pub. No.: WO2017/174197
PCT Pub. Date: Oct. 12, 2017

(65) Prior Publication Data
US 2019/0153584 A1    May 23, 2019

(30) Foreign Application Priority Data
Apr. 7, 2016 (DE) .......................... 102016003998.1

(51) Int. Cl.
*C23C 14/06* (2006.01)
*C23C 14/00* (2006.01)
*C23C 14/32* (2006.01)

(52) U.S. Cl.
CPC ...... *C23C 14/0641* (2013.01); *C23C 14/0021* (2013.01); *C23C 14/325* (2013.01)

(58) Field of Classification Search
CPC ........................... C23C 14/061; C23C 14/325
(Continued)

(56) References Cited

U.S. PATENT DOCUMENTS

| 5,601,293 A | 2/1997 | Fukutome et al. |
| 6,274,257 B1 * | 8/2001 | Aharonov ................ B22C 3/00 428/699 |

(Continued)

FOREIGN PATENT DOCUMENTS

| CN | 102534532 | * | 7/2012 |
| DE | 102012207814 A1 | | 11/2013 |

(Continued)

OTHER PUBLICATIONS

Kim et al "Synthesis and mechanical properties of Cr—Mo—N coatings by a hybrid coating system" Surface & Coatings Technology 201 p. 4068-4072. (Year: 2006).*

(Continued)

*Primary Examiner* — Archene A Turner
(74) *Attorney, Agent, or Firm* — Polson Intellectual Property Law, PC; Margaret Polson; Christopher Sylvain

(57) ABSTRACT

The present invention relates to a component comprising a surface coated with a coating comprising a MoxCryN layer, where x and y correspond to the coefficients of Mo content and Cr content in atomic percentage, respectively, when only Mp and Cr are considered, and so x+y is considered to be 100 at %.

19 Claims, 4 Drawing Sheets

(58) Field of Classification Search
USPC .......................................... 428/697, 698, 699
See application file for complete search history.

(56) References Cited

U.S. PATENT DOCUMENTS

| | | | |
|---|---|---|---|
| 2010/0171272 A1* | 7/2010 | Hoppe | C23C 14/325 |
| | | | 277/444 |
| 2013/0134033 A1 | 5/2013 | Lyo et al. | |
| 2015/0044508 A1* | 2/2015 | Takazaki | C23C 28/042 |
| | | | 428/697 |
| 2015/0211635 A1* | 7/2015 | Wu | C23C 14/0021 |
| | | | 277/443 |

FOREIGN PATENT DOCUMENTS

| | | |
|---|---|---|
| JP | H08178069 A | 7/1996 |
| JP | H08199337 A | 8/1996 |
| JP | 2009235561 A | 10/2009 |
| JP | 2009287063 A | 12/2009 |
| WO | 2015034086 A1 | 12/2015 |

OTHER PUBLICATIONS

Yujiao Zou et al: "Thermal stability and mechanical properties of sputtered Chromium-Molybdenum-Nitride 'CrMoN) coatings", Journal of Achievements in Materials and Manufacturing Engineering, vol. 37, No. 2, Dec. 1, 2009 (Dec. 1, 2009). 8 pages.
International Search Report dated Jun. 23, 2017 in parent International application PCT/EP2017/000437.
Written Opinion of the International Searching Authority dated Jun. 23, 2017 in parent International application PCT/EP2017/000437.
Office Action dated Feb. 25, 2021 in related Japanese application 2018-552767.

* cited by examiner

200 μm

100 μm

WEAR AND/OR FRICTION REDUCTION BY USING MOLYBDENUM NITRIDE BASED COATINGS

BACKGROUND

The present invention relates to coatings for attaining reduction of wear or reduction of friction on surfaces of components. Such components for example can be used in the automotive sector or precision components (i.e. highly engineered components) sector. In this regard the components can be for example piston pins, cam followers or piston rings or nozzle needles.

The use of molybdenum coatings or molybdenum comprising coatings is well known. The use of molybdenum nitride as wear reduction coating on surfaces of components is in particular well known.

The behavior of the interface between the substrate surface of the component and the molybdenum nitride coating is however still today unsatisfactory and insufficient for meeting the current industrial requirements during application of the so coated components.

This has been especially observed when the substrate material to be coated is not hard enough, it means in this context that the substrate material has a hardness for example between 50-65 HRC, in any case not higher than 65 HRC.

FIG. 1 shows a picture of a coated surface after Rockwell indentation HRC, where the hardness of the substrate is between 50 and 65 HRC and the substrate is coated with MoN. Ring-shaped fracture of the MoN coating can be clearly observed surrounding the HRC Rockwell indentation.

It is possible that the observed ring-shaped fracture has been produced as a consequence of the big difference between the hardness and Young's modulus of the MoN coating and the hardness and Young's modulus of the substrate material. It is supposable, because actually the hardness and Young's modulus in the molybdenum nitride coating are considerable higher in comparison with the substrate, and consequently it is possible that the substrate has been considerably deformed during the application of the indentation load, while the MoN coating has been less deformed and therefore the MoN coating cracked.

For this reason this can be in particular a big problem when variable loads (interrupted load) are applied on the coated substrate of the component.

Essentially this problem can be avoided by using substrates having a higher hardness, such as e.g. substrates made of cemented carbide. However the components used in many automotive applications are made of materials which have Rockwell hardness lower than 65 HRC.

SUMMARY

The objective of the present invention is to modify the molybdenum nitride coating and/or the substrate surface to be coated in order to improve the contact between substrate surface and MoN coating when the substrate exhibit a hardness of 65 HRC or lower and the coated substrate is subjected to load Or especially to interrupted load.

In particular it is intended that the inventive solution makes possible that no ring-shaped fracture lines are produced during Rockwell indentation by conduction of HRC Rockwell tests in substrates coated with MoN based coatings when the substrate hardness is lower or equal to 65 HRC.

According to a first possible solution the component surface to be coated with the MoN coating is previously modified by subjecting it to a nitriding process in order to increase the substrate surface hardness before depositing the MoN coating. Afterwards the MoN coating is applied on the component surface which was previously hardened by nitriding as mentioned above. The MoN coating can be deposited for example by using a reactive PVD process. Preferably a reactive arc PVD process is used for depositing the MoN coating on the hardened component surface. It is a special advantage of the used method that the nitriding process of the substrate and the coating process are done in one machine. This guarantees a good adhesion between the nitriding layer and the coating without formation of a white layer. The MoN coating can be deposited exhibiting a hexagonal phase or a cubic phase or a mixture of hexagonal and cubic phases.

FIG. 2 shows a picture of a surface coated according to the above mentioned first possible solution and afterwards was tested according to the standard HRC Rockwell test. In this picture it is clear to see that no ring-shaped fracture lines surrounding the Rockwell indentation can be observed.

According to a second possible solution the component surface to be coated is coated with a modified MoN coating. In this case it is not necessary to modify previously the component surface to be coated. The modified MoN coating according to this second possible solution exhibits a multilayer structure, which comprises alternate deposited layers of MoN and layers of CrN. Especially good results i.e. Rockwell indentations without ring-shaped fracture lines or further adhesive failures were in particular observed by using this second possible solution when the thickness of the multilayer coating was about 4 to 5 µm. Also in this case the MoN layers can be deposited exhibiting a hexagonal phase or a cubic phase or a mixture of hexagonal and cubic phases. It might be however that for a specific application less coating thickness is suitable because the load in a real application might be not as high as in the HRC Rockwell test. In this case a thickness of for example 2 µm might be enough.

The MoN and CrN layers can be deposited for example by using a reactive PVD process. Preferably a reactive arc PVD process is used for depositing the MoN and the CrN layers.

According to a preferred embodiment of the present invention the component surface to be coated is coated with a modified MoN coating, wherein the MoN coating is modified by adding Cr. In this case it is also not necessary to modify previously the component surface to be coated. The modified MoN coating according to this embodiment of the present invention is a Cr containing MoN coating exhibiting a monolayer structure and having chemical composition given by the formula $Mo_xCr_yN$, where x and y correspond to the coefficients of Mo content and Cr content in atomic percentage, respectively, when only Mo and Cr are considered, and so x+y is considered to be 100 at %. Preferably $5 \leq y \leq 50$. More preferably $20 \leq y \leq 40$. The Cr content in the $Mo_xCr_yN$ can be varied along the thickness of the $Mo_xCr_yN$ layer.

Since as described in the first possible solution the component surface to be coated with a MoN coating must be previously nitrided and standard nitriding processes are conducted at temperatures of 450° C. or higher, only components made of materials which can resist such temperatures can be treated in this manner. In this regard, the second possible solution (MoN/CrN multilayer) and the above mentioned preferred embodiment of the present invention ($Mo_xCr_yN$) involves the advantage that the coating process can be conducted at temperatures of 200° C. and no nitriding step is necessary, hence components made of temperature sensitive materials can be treated, like for example piston pins.

Since the thickness of the individual layers of a multilayer coating comprising MoN and CrN layers as described in second possible solution can depend strongly on the geometry i.e. of the form and dimensions of the surface of the component to be treated as well as the position of the component surface to be coated in relation to the coating source during coating process. Consequently it could be complicated to produce such multilayer structures if the component to be treated has a complex geometry. In this regard, the preferred embodiment of the present invention involves the advantage that only a monolayer must be deposited. Furthermore this preferred embodiment involves the advantage that surprisingly with lower coating thicknesses of the MoxCryN layer, i.e. already with thickness of about 2 μm it was possible to obtain very good results and pictures of the treated surface after HRC Rockwell test. The HRC Rockwell test showed no ring-shaped fracture lines with 2 μm coating thickness and also not any sign of adhesive failure, while in the case of using a MoN/CrN multilayer a thickness of about 4 μm was necessary.

However as already mentioned above it might be, that in a real automotive application also a 2 μm thick MoN/CrN Multilayer solution would work.

It was observed that in some cases a further improved contact in the context of the present invention was attained by providing an adhesion layer made of CrN. This adhesion layer was deposited for example before depositing the MoN coating according to the first possible solution or before depositing the modified MoN coating according to the second possible solution, or before depositing the MoxCryN monolayer according to the above mentioned preferred embodiment of the present invention, respectively. The CrN adhesion layer is preferably provided having a layer thickness of at least 30 nm. The thickness of the CrN adhesion layer preferably between 0.05 μm and 1 μm.

BRIEF DESCRIPTION OF THE DRAWINGS

FIG. 3a shows the coated surface of the qualified reference sample and FIG. 3b shows the piston pin, respectively, which were only coated with a MoN coating;

FIG. 3c shows the coated surface of the qualified reference sample and FIG. 3d shows the piston pin, respectively, which were coated according to example 1.

DETAILED DESCRIPTION OF EXAMPLES

Example 1

A qualified reference sample made of 1.2842 19MnCrV8 with hardness 64 HRC before coating (following referred to as QRS) test piece having a steel surface and a piston pin were coated with a coating comprising a first layer consisting of CrN, which was deposited as adhesion improving layer, and a MoxCryN monolayer according to the present invention was deposited onto the CrN layer. The CrN layer was deposited by evaporating two Cr targets by using Arc PVD techniques in a nitrogen containing atmosphere. MoxCryN layer was also deposited by means of a reactive Arc PVD process. For depositing the MoxCryN layer two targets comprising Mo and two targets comprising Cr were evaporated by using Arc PVD techniques in nitrogen comprising atmosphere. The desired element composition of the MoxCryN layer was adjusted by varying the arc current at the targets operated as cathodes. The element composition of the MoxCryN layer was measured by EDX and it was determined that y was approximately 34 at %. The thickness of the CrN and MoxCryN layer was also measured and it was determined that it was 0.4 μm for the CrN layer and 2 μm for the MoxCryN, respectively. No nitriding treatment was performed before coating.

With the intention of comparing the inventive coated surfaces with not inventive coated surfaces, a QRS and a piston pin were coated with a MoN coating (including a thin CrN adhesion layer) without performing previously a nitriding treatment.

Afterwards corresponding Rockwell tests were carried out on all coated surfaces.

Figure 1:
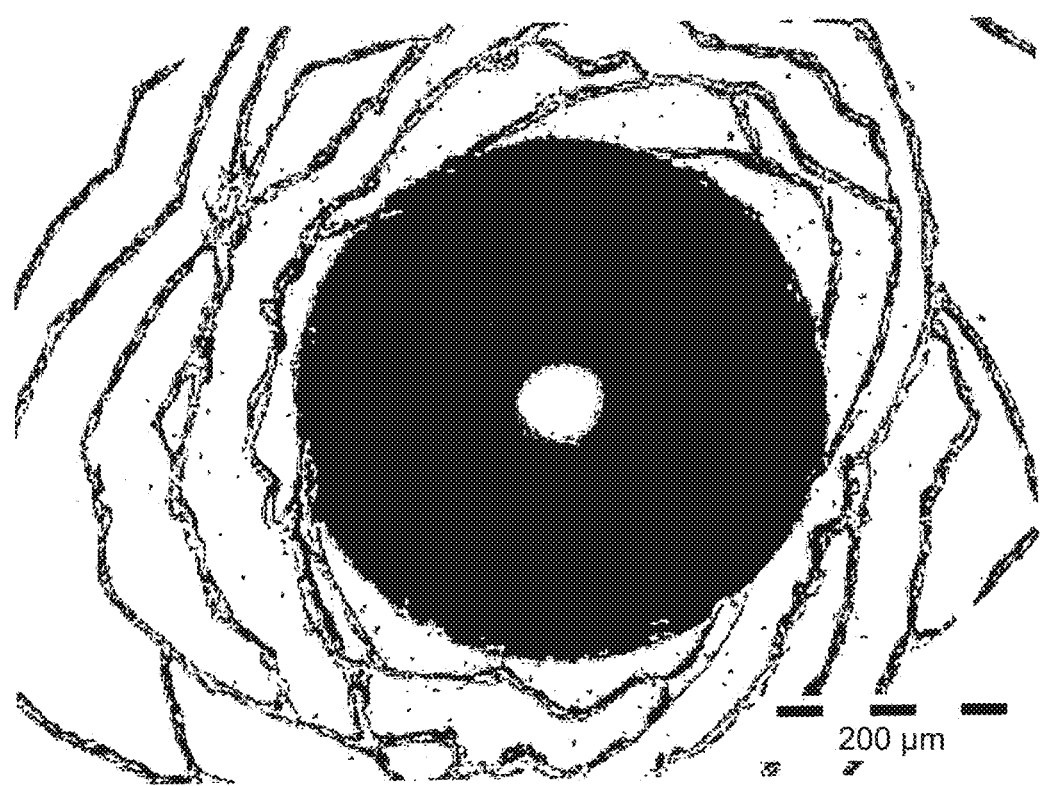
FIG. 1 shows a picture of a coated surface after Rockwell indentation HRC, where the hardness of the substrate is between 50 and 65 HRC and the substrate is coated with MoN.
Figure 2:
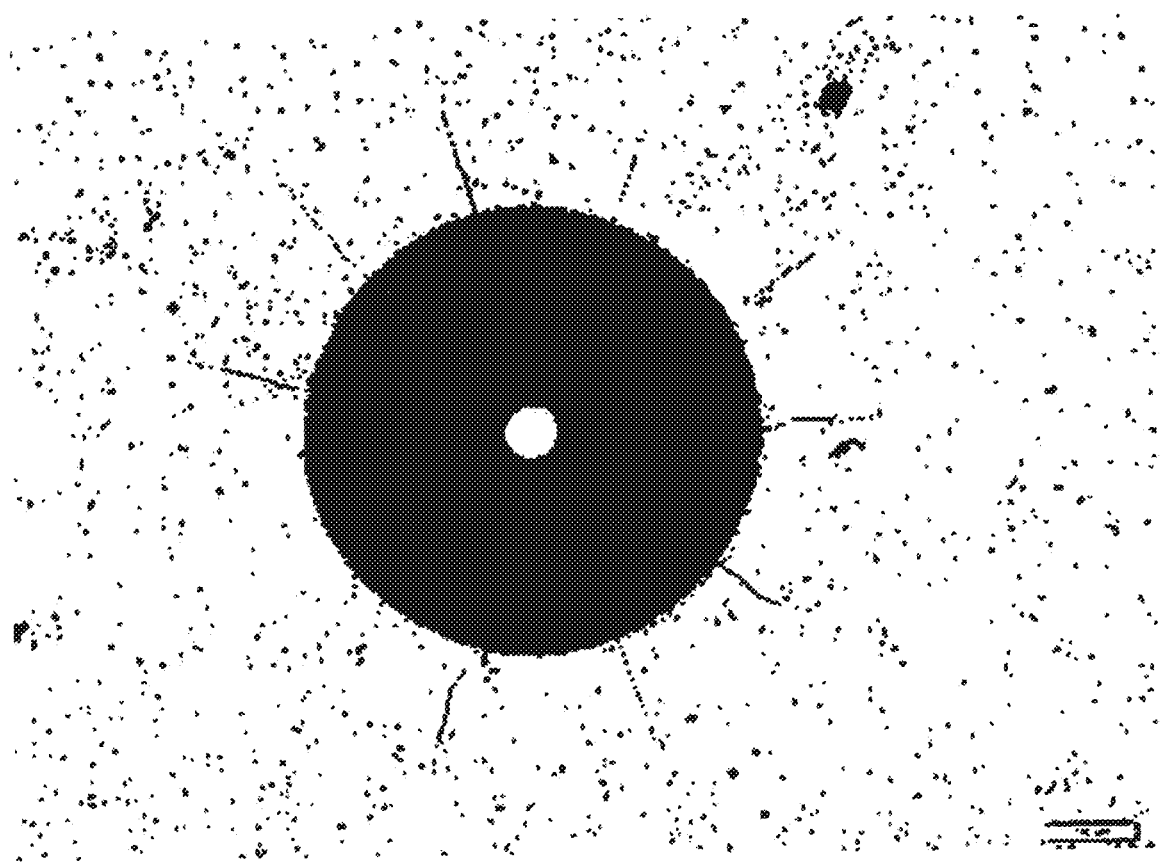
FIG. 2 shows a picture of a surface coated according to the above mentioned first possible solution and afterwards was tested according to the standard HRC Rockwell test.
Figures 3A, 3C:
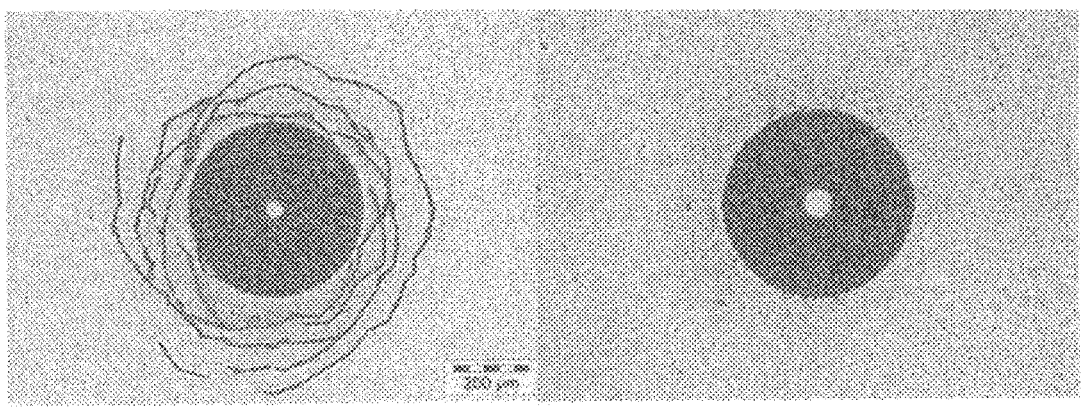
FIGS. 3a and 3b show pictures of tested surfaces after Rockwell indentation, where
FIGS. 3c and 3d shows pictures of tested surfaces after Rockwell indentation, where
Figures 3B, 3D:
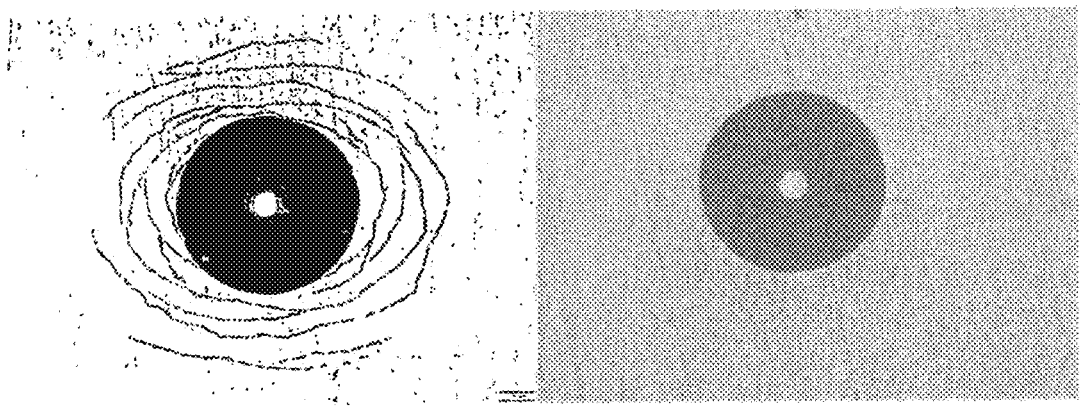

The pictures of the tested surfaces after Rockwell indentation are shown in FIGS. 3a-d. FIGS. 3a and 3b on the left side show the coated surface of the QRS (on the top) and the piston pin (on the bottom), respectively, which were only coated with a MoN coating. FIGS. 3c and 3d on the right side show the coated surface of the QRS (on the top) and the piston pin (on the bottom), respectively, which were coated according to the above described example of the present invention.

Neither ring-shaped fracture lines nor any sign of adhesive failure were observed on the surfaces coated according to the present invention.

Example 2

A nozzle needle was coated with a coating comprising a first layer consisting of CrN, which was deposited as adhesion improving layer, and a MoxCryN monolayer according to the present invention was deposited onto the CrN layer. The same method as described in example 1 was used for depositing the coating in this example. Only the arc current at the Cr targets was adjusted to be 20 Amperes higher during deposition of the MoxCryN monolayer in order to obtain a higher Cr content in comparison with example 1. The thickness of the CrN and MoxCryN layer was measured and it was determined that it was 0.7 μm for the CrN layer and 2.3 μm for the MoxCryN, respectively.

Afterwards corresponding HRC Rockwell tests were carried out on the coated surface of the nozzle needle.

Figure 4:
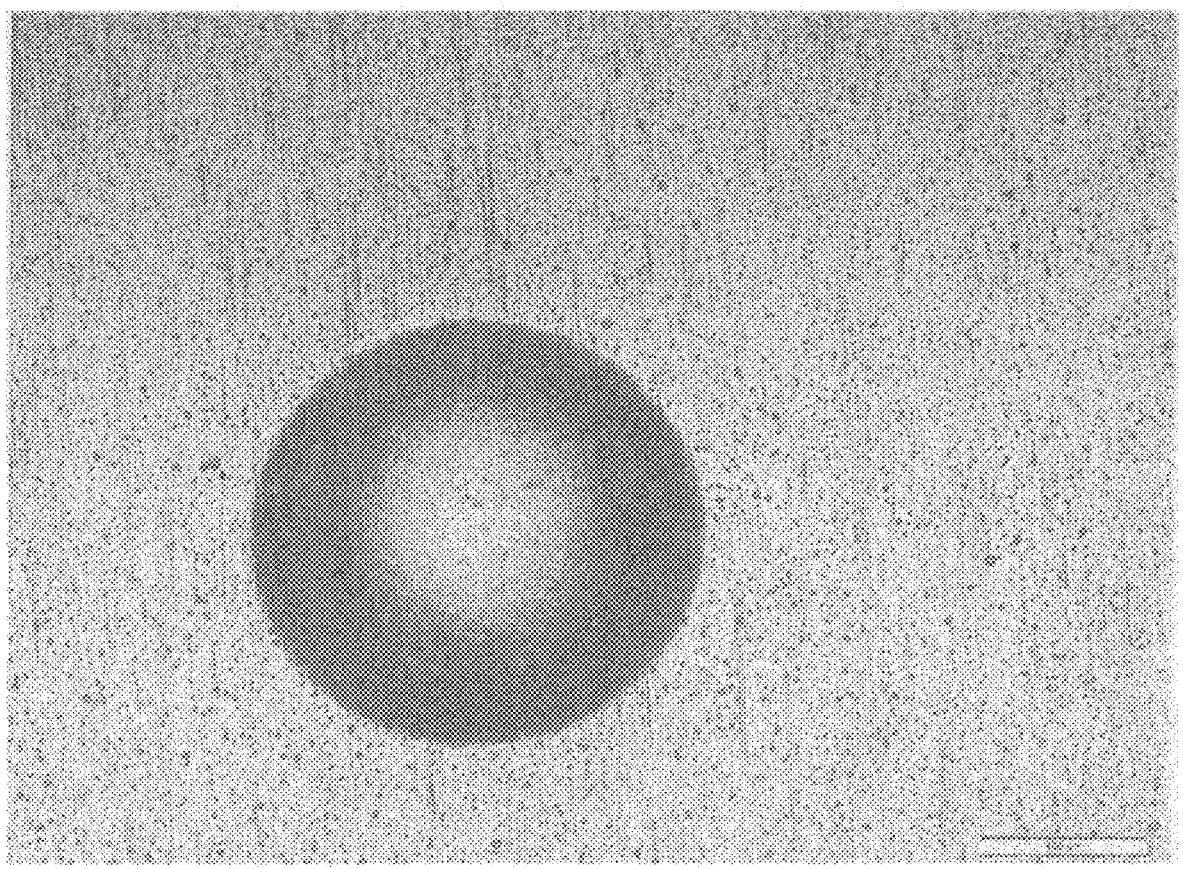
FIG. 4 shows a picture of the tested surface after Rockwell indentation, which was coated according to example 2.

A picture of the tested surface after Rockwell indentation is shown in FIG. 4. Neither ring-shaped fracture lines nor any sign of adhesive failure were observed.

Particularly good results were observed with $20 \leq y \leq 40$.

The components coated according to the present invention can be produced by using any PVD technique. For example the MoxCryN layer can be deposited by means of a reactive PVD process. The reactive PVD process can be a reactive Arc PVD process, wherein during deposition of the MoxCryN at least one target comprising Mo and Cr or at least one target comprising Mo and at least one target comprising Cr are evaporated by using Arc PVD techniques in an atmosphere comprising nitrogen as reactive gas.

However the methods for producing coated components according to the present invention are not limited by this description.

The surfaces of the components coated according to the present invention exhibit additionally very good tribological properties, in particular concerning wear resistance and reduced friction.

The invention claimed is:

1. A component comprising:
a surface coated with a coating comprising a $Mo_xCr_yN$ layer, where x and y correspond to the coefficients of Mo (molybdenum) content and Cr (chromium) content in atomic percentage (at%), respectively, when only Mo and Cr are considered, and so x_+_y=100 at%,
wherein the $Mo_xCr_yN$ layer is a monolayer,
wherein the surface of the component which is coated has a hardness equal or lower than 65 HRC,
wherein the Cr content in the $Mo_xCr_yN$ layer is varied along the thickness of the $Mo_xCr_yN$ layer.

2. The component of claim 1, wherein 5 at %<y<50 at %.

3. The component of claim 1, wherein 20 at %<y<40 at %.

4. The component of claim 1, wherein the coating comprises a CrN layer deposited between the surface of the component and the $Mo_xCr_yN$ layer.

5. The component of claim 2, wherein the coating comprises a CrN layer deposited between the surface of the component and the $Mo_xCr_yN$ layer.

6. The component of claim 3, wherein the coating comprises a CrN layer deposited between the surface of the component and the $Mo_xCr_yN$ layer.

7. The component of claim 2, wherein the component is an automotive component or a precision component.

8. The component of claim 3, wherein the component is an automotive component or a precision component.

9. The component of claim 4, wherein the component is an automotive component or a precision component.

10. The component of claim 2, wherein the thickness of the $Mo_xCr_yN$ layer is about 2 μm.

11. The component of claim 3, wherein the thickness of $Mo_xCr_yN$ layer is about 2 μm.

12. The component of claim 4, wherein the thickness of the $Mo_xCr_yN$ layer is about 2 μm.

13. The component of claim 1, wherein the component is an automotive component or a precision component.

14. A method for producing the component of claim 1, wherein the $Mo_xCr_yN$ layer is deposited by means of a reactive PVD process.

15. The method of claim 14, wherein the reactive PVD process is a reactive Arc PVD process, and wherein during deposition of the $Mo_xCr_yN$ layer, at least one target comprising Mo and Cr or at least one target comprising Mo and at least one target comprising Cr are evaporated by using Arc PVD techniques in an atmosphere comprising nitrogen as reactive gas.

16. The method of claim 14, wherein the surface of the component is not modified prior to deposition of the $Mo_xCr_yN$ layer.

17. The method of claim 14, wherein the component surface is not nitrided.

18. The method od claim 14, wherein the reactive PVD process is conducted at 200° C.

19. The component of claim 1, wherein the thickness of the $Mo_xCr_yN$ layer is about 2 μm.

* * * * *